(12) United States Patent
Kojima et al.

(10) Patent No.: US 7,172,657 B2
(45) Date of Patent: Feb. 6, 2007

(54) CLEANING METHOD OF TREATMENT EQUIPMENT AND TREATMENT EQUIPMENT

(75) Inventors: Yasuhiko Kojima, Nirasaki (JP); Yasuhiro Oshima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 125 days.

(21) Appl. No.: 09/801,825

(22) Filed: Mar. 9, 2001

(65) Prior Publication Data

US 2001/0020478 A1 Sep. 13, 2001

(30) Foreign Application Priority Data

Mar. 10, 2000 (JP) .......................... P2000-067827

(51) Int. Cl.
*B08B 3/10* (2006.01)
*B08B 9/00* (2006.01)

(52) U.S. Cl. .............. 134/3; 134/2; 134/19; 134/21; 134/22.1; 134/22.19; 134/36; 134/37; 134/41; 134/102.1

(58) Field of Classification Search ............... 148/279, 148/280, 283; 134/2, 3, 19, 21, 22.1, 22.13, 134/22.19, 31, 34, 35, 36, 37, 41, 42, 902, 134/102.1; 438/905
See application file for complete search history.

(56) References Cited

U.S. PATENT DOCUMENTS

| | | | | |
|---|---|---|---|---|
| 4,238,399 A | * | 12/1980 | Grethe et al. .............. 549/396 |
| 5,213,621 A | * | 5/1993 | Ivankovits et al. ............. 134/3 |
| 5,413,758 A | * | 5/1995 | Caputo et al. ................. 422/22 |
| 5,993,679 A | | 11/1999 | Koide et al .................... 216/74 |
| 6,090,960 A | * | 7/2000 | Senzaki et al. ................. 556/9 |
| 6,176,936 B1 | | 1/2001 | Taguwa |
| 6,423,148 B1 | * | 7/2002 | Aoki .............................. 134/3 |
| 6,893,964 B2 | * | 5/2005 | Oshima ....................... 438/680 |
| 2001/0009154 A1 | * | 7/2001 | Nguyen et al. ................. 134/1 |
| 2001/0020478 A1 | * | 9/2001 | Kojima et al. ................. 134/3 |

FOREIGN PATENT DOCUMENTS

| | | | |
|---|---|---|---|
| DE | 19833448 A1 | * | 2/2000 |
| JP | 08-115886 | | 5/1996 |
| JP | 11-043771 | | 2/1999 |
| JP | 11-140652 | | 5/1999 |
| KR | 10-0306407 | | 10/2001 |

* cited by examiner

*Primary Examiner*—Zeinab El-Arini
(74) *Attorney, Agent, or Firm*—Pillsbury Winthrop Shaw Pittman LLP (57) ABSTRACT

In a state of the inside of a treatment chamber of treatment equipment being evacuated, therein a cleaning gas containing trifluoroaceticacid (TFA) as a cleaning agent is supplied. Metal such as copper used in the formation of an interconnection or an electrode and stuck on an inner wall surface of the treatment chamber, when coming into contact with the cleaning agent (TFA) in the cleaning gas, without forming an oxide or a metallic salt, is directly complexed. The complex is sublimed due to the evacuation and is exhausted outside the treatment chamber. Accordingly, at less labor and low cost, the cleaning can be efficiently implemented.

16 Claims, 8 Drawing Sheets

FIG. 8

CLEANING METHOD OF TREATMENT EQUIPMENT AND TREATMENT EQUIPMENT

CROSS REFERENCE TO RELATED APPLICATIONS

This application claims priority to Japanese application No. 2000-67827, filed Mar. 10, 2000, the content of which is incorporated herein in its entirety by reference.

BACKGROUND OF THE INVENTION

1. Field of the Invention

The present invention relates to a cleaning method of cleaning equipment, in particular to a cleaning method for removing metal or the like stuck to an inner wall of a treatment chamber of the treatment equipment and treatment equipment enabling such cleaning.

2. Description of the Related Art

When depositing, by the use of treatment equipment such as Chemical Vapor Deposition (CVD) equipment or the like, a thin metal film on a Si wafer (hereafter refer to as "wafer"), after accommodating the wafer in the treatment chamber, a treatment gas is supplied. The treatment gas contains various kinds of metals such as copper, the metal segregating in thin film on the wafer.

When the treatment gas sticks on an inner wall of the treatment chamber, also on the inner wall surface of the treatment chamber, a thin metal film is formed. The thin film stuck on the inner wall surface of the treatment chamber, when being left as it is, may cause problems when treating the wafer. Accordingly, it is necessary to implement periodical cleaning of the treatment chamber to remove the thin metal film stuck on the inner wall surface.

When the thin metal film is composed of metal difficult to ionize such as copper or the like, it can be removed with difficulty. Accordingly, in the treatment chamber to which the thin metal film such as copper or the like sticks, an oxidizing agent is supplied to oxidize copper to copper oxide. Thereafter, the copper oxide is removed to clean the inside of the treatment chamber.

For instance, in Japanese Patent Publication No. JP-A-11-140652, the following cleaning method of treatment equipment is disclosed:

(1) First, metal stuck on a treatment chamber wall is oxidized to form metal oxide.
(2) Then, the oxide is transformed to a metal complex.
(3) Thereafter, the inside of the treatment chamber is evacuated to sublime the metal complex.

Thus by implementing the processes of oxidizing, complexing and subliming, the thin metal film stuck on the inner wall surface of the treatment chamber is removed.

In the method, however, three steps are required to increase a total number of steps, resulting in problems.

In addition, in the above method, β-diketone is employed in the complexing step. The β-diketone, being expensive, pushes up material costs in cleaning.

In addition, in the above method, since the step of oxidizing is included, oxygen may remain in the treatment chamber. Accordingly, due to the remaining oxygen, the treatment chamber may be caused to deteriorate or the wafer may be adversely affected.

SUMMARY OF THE INVENTION

An object of the present invention is to provide a cleaning method capable of efficiently cleaning treatment equipment with a small number of steps and treatment equipment furnished with a cleaning mechanism capable of implementing such cleaning.

Furthermore, another object of the present invention is to provide a cleaning method capable of efficiently cleaning treatment equipment without employing expensive cleaning material and at low cost and treatment equipment provided with a cleaning mechanism capable of implementing such cleaning.

Furthermore, still another object of the present invention is to provide a cleaning method in which treatment capability of treatment equipment does not deteriorate after the treatment or quality of a treated wafer does not fluctuate and treatment equipment furnished with a cleaning mechanism capable of implementing such cleaning.

(1) In order to accomplish the above object, a cleaning method of the present invention comprises a step of, while supplying a cleaning gas in a treatment chamber of treatment equipment that treat a substrate, exhausting the cleaning gas from the treatment chamber. Here, the cleaning gas including a substance that directly complexes a prescribed metal.

According to the present invention, the cleaning step is implemented by the use of a cleaning gas including a substance that directly complexes metal forming electrode or interconnection. As a result, upon supply of the cleaning gas in the treatment chamber, metal stuck on the inner wall surface of the chamber is shortly complexed. The complexed metal is removed, due to evacuation, from the treatment chamber together with the cleaning gas. Accordingly, the number of steps when cleaning is small and cleaning can be shortly implemented without complexity.

In addition, there is no step of oxidizing metal stuck on the inside wall of the treatment chamber. Accordingly, there is no possibility for the remaining oxygen to be adversely affected.

"The prescribed metal" means metal to use in the formation of electrode or interconnection of a semiconductor device, for instance copper, aluminum, gold, silver or the like being cited. The above cleaning method is particularly effective in removing metal difficult to ionize such as copper.

Furthermore, "substance that directly complexes metal" means a substance that, without requiring a particular additional step of forming metal oxide or metallic salt by the use of an oxidizing gas or the like, directly reacts with the metal to form a complex. As the example of the "substance that directly complexes metal", carboxylic acid and carboxylic acid derivatives can be cited.

Specifically, substances expressed by for instance RCOOH, RCOOR', or R(COOH)$_n$ (R and R' denote hydrocarbon group that may contain halogen atom, n being an integer number) can be cited, more specifically trifluoroacetic acid (TFA) being preferable.

By the use of less expensive material such as organic carboxylic acid or the like such as TFA as a cleaning agent, the material cost in cleaning is not pushed up, resulting in less expensive cleaning.

As examples of "treatment equipment", film forming equipment such as Chemical Vapor Deposition (CVD) equipment, Physical Vapor Deposition (PVD) equipment, and plating equipment, or etching equipment, Chemical Mechanical Polishing (CMP) equipment can be cited.

An additive for promoting the complexing of the prescribed metal may be contained in the above cleaning gas.

Due to the addition of the additive, the complexing reaction is promoted to shorten the time for cleaning. As the additive, water vapor can be used for instance.

(2) Another cleaning method of the present invention comprises the steps of supplying a cleaning gas and of exhausting the cleaning gas. In the step of supplying a cleaning gas, a cleaning gas containing a substance that directly complexes prescribed metal is supplied into a treatment chamber of treatment equipment for treating a substrate. In the step of exhausting the cleaning gas, the cleaning gas is exhausted from the treatment chamber.

There is not a step of oxidizing the metal stuck onto the inner wall surface of the treatment chamber. Accordingly, cleaning can be shortly carried out without difficulty. There is not a possibility that remaining oxygen adversely affects. Furthermore, the complexing and exhausting each are completely done, resulting in efficient cleaning.

In the above method, the supplying step and the exhausting step maybe alternately repeated. Thereby, the treatment chamber can be assuredly cleaned.

(3) Treatment equipment of the present invention comprises a treatment chamber, a susceptor, a treatment gas supply system, an evacuating system and a TFA supply system. In the treatment chamber, a substrate is treated. The susceptor is disposed in the treatment chamber, on the susceptor the substrate being disposed. The treatment gas supply system supplies a treatment gas containing copper as a component in the treatment chamber. The evacuating system evacuates the inside of the treatment chamber. The TFA supply system supplies trifluoroacetic acid in the treatment chamber.

The treatment equipment of the present invention, being furnished with the TFA supply system in the treatment chamber to supply trifluoroacetic acid (TFA), can implement cleaning by a small number of steps, at low cost and without damaging the treatment equipment.

In the aforementioned treatment equipment, as the treatment gas supply system, for instance one that comprises a treatment agent tank, treatment gas supply piping connecting the treatment chamber and the treatment agent tank, and a treatment agent vaporizer disposed in the middle of the treatment gas supply piping can be cited.

Furthermore, as the TFA supply system, for instance one that comprises a TFA tank and TFA supply piping connecting the TFA tank and the treatment gas supply piping downstream the treatment agent vaporizer in a direction of a gas movement can be cited. As a result, metal stuck on an inner wall of the treatment gas supply piping can be cleaned.

In addition, in the above treatment equipment, it is preferable to dispose a heater at least in a portion downstream the vaporizer of the treatment agent supply piping. By heating the piping by means of the heater, the inside of the piping can be more efficiently cleaned.

For instance, in the treatment chamber, a heater for heating the inner wall of the treatment chamber, for instance a heater capable of electrically heating such as Nichrome wire or the like may be built in.

As the treatment agent tank, a tank containing a treatment agent essentially consisting of copper can be cited.

The treatment equipment may comprise a supply system for supplying an additive that promotes the complexing of copper. By the addition of the additive, the completing can be promoted to result in shortening of the cleaning time. The supply system can be constituted of for instance piping connected to any one of the treatment chamber, the treatment gas supply piping and the TFA supply piping.

DESCRIPTION OF PREFERRED EMBODIMENT (1st Mode of Implementation)

In the following, a cleaning method and treatment equipment involving a first implementation mode of the present invention will be explained.

Figure 1:
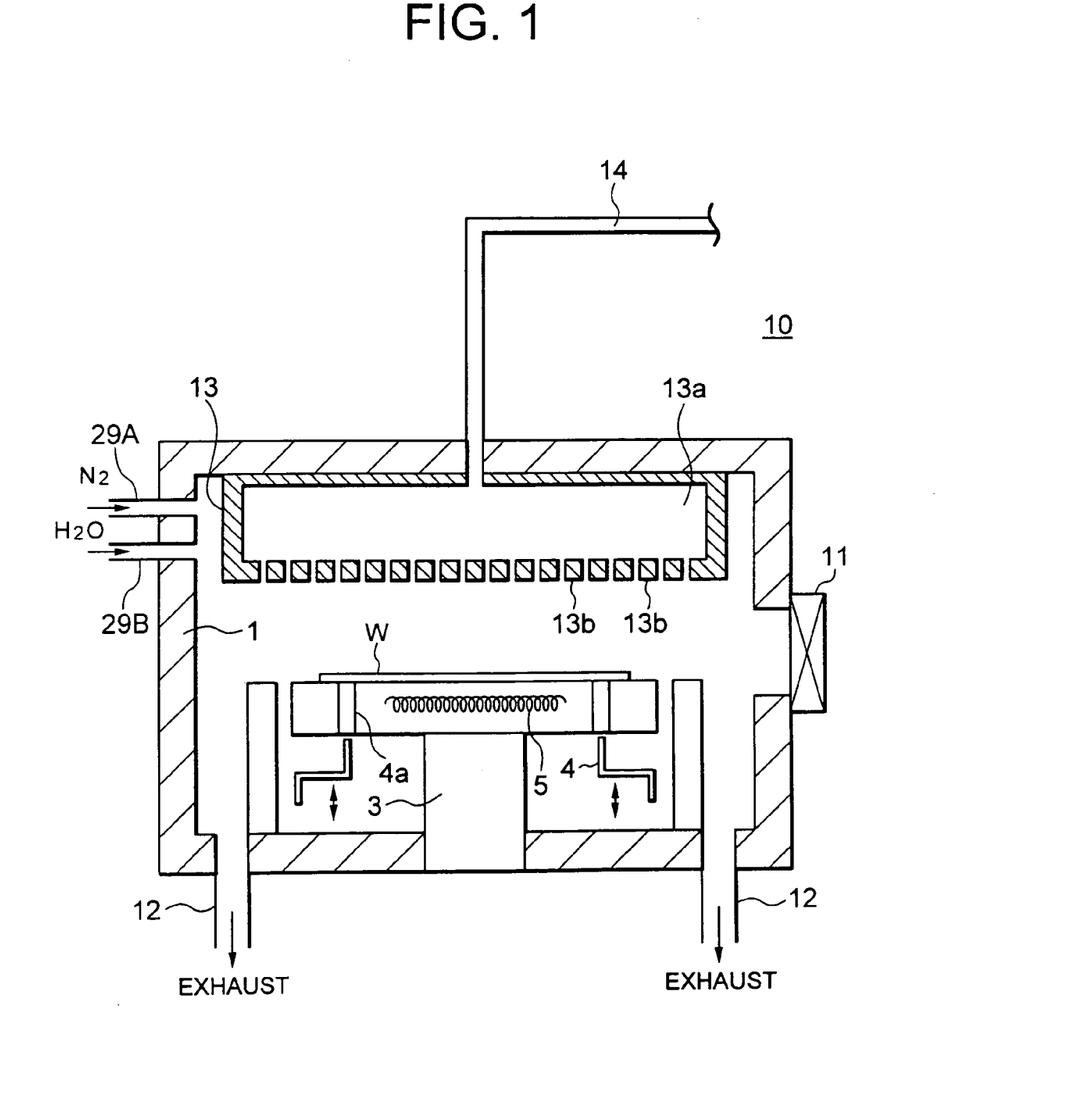
FIG. 1 is a vertical section showing an entire configuration of treatment equipment (CVD equipment) involving the present invention.

FIG. 1 is a vertical section showing an entire configuration of CVD equipment furnished with a cleaning mechanism involving the present invention.

As shown in FIG. 1, the treatment equipment 10 comprises a treatment chamber 1 formed in approximate cylinder from for instance Al or the like.

On a ceiling of the treatment chamber 1, a showerhead 13 is disposed to supply a treatment gas therein. The showerhead 13 comprises a diffusion chamber 13a having a base plate where a plurality of orifices 13b, 13b and so on are bored. The treatment gas supplied through a treatment gas supply piping 14 to the showerhead 13, after diffused once in the diffusion chamber 13a, is discharged from the orifices 13b, 13b and so on to a wafer W disposed on a susceptor 2.

On a sidewall surface in the neighborhood of the ceiling of the treatment chamber 1, piping 29A and 29B are disposed for nitrogen and water vapor, respectively. The piping 29A supplies a nitrogen gas to replace an atmosphere in the treatment chamber when for instance the wafer W is transferred in and out of the treatment chamber 1. The piping 29B, as mentioned below, supplies an additive such as water vapor that promotes a complexing reaction in the treatment chamber 1.

Inside the treatment chamber 1, the susceptor 2 for disposing the wafer W as a substrate to be treated is supported by a base through a prop 3. As material of the susceptor 2, for instance graphite, amorphous carbon, composite carbon, and AlN can be used. Downward the susceptor 2, a lifter pin 4 made of quartz glass is disposed movable up and down by not shown elevating means. The lifter pin 4 penetrates a through hole 4A disposed in the susceptor 2 to hold up the wafer W when transferring in and out.

Inside the susceptor 2, a powerful heater 5 consisting of Nichrome wire or the like is disposed. By means of the heater 5, the susceptor 2 in the treatment chamber 1 is heated, thereby indirectly heating the wafer W at a temperature in the range of for instance from approximate 150 to 300° C. to maintain there.

On the sidewall of the treatment chamber 1, a gate valve 11 is disposed to open when transferring the wafer W in and out of the treatment chamber 1. At a periphery of a base of the treatment chamber 1, an exhaust 12 connected to a vacuum pump not shown in the figure is disposed to evacuate the treatment chamber 1.

Figure 2:
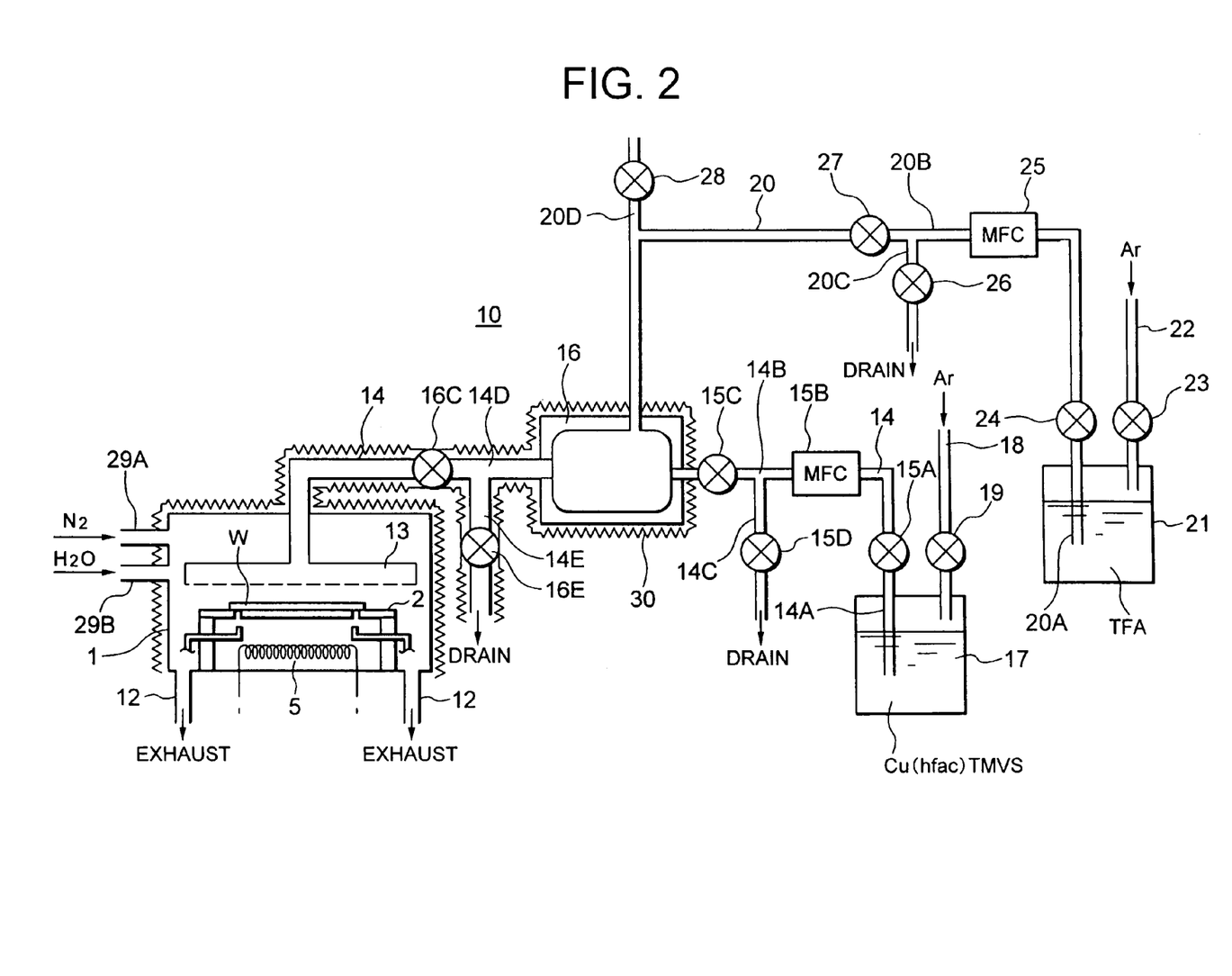
FIG. 2 is a diagram schematically showing a piping route of treatment equipment involving the present invention.

FIG. 2 is a diagram schematically showing piping route of the treatment equipment involving present implementation mode.

As shown in FIG. 2, to the piping 14A upstream the treatment gas supply piping 14 connected to the showerhead 13 in the treatment chamber 1, a treatment agent tank 17 is connected to receive the treatment agent.

At an upper portion of the treatment agent tank 17, inert gas supply piping 18 for supplying an inert gas such as Ar or the like is disposed together with an opening valve 19. Through the piping 18, an inert gas such as Ar or the like is supplied into the treatment agent tank 17. A liquid surface of the treatment agent is pushed down by the supplied inert gas, thereby the treatment agent in the treatment agent tank 17 being supplied into the piping 14.

In the treatment agent tank 17, a treatment agent for forming a thin film of the metal used for the formation of an interconnection or an electrode of a semiconductor element, for instance copper, is accommodated. For instance, precursors containing copper, in more detail, the following substances can be cited.

The treatment agent contains $Cu^{+1}$ (hexafluoroacetylacetonate) and silyl olefin ligand.

The silylolefin ligand is contained in a substance selected from a group consisting of trimethylvinylsilane (TMVS), dimethoxymethylvinylsilane (DMOMVS), methoxydimethylvinylsilane (MODMVS), trimethoxyvinylsilane (TMOVS), triethoxyvinylsilane (TEOVS), ethoxymethoxymethylvinylsilane (EOMOMVS), diethoxymethylvinylsilane (DEOMVS), diethoxymethoxyvinylsilane (DEOMOVS), ethoxydimethoxyvinylsilane (EODMOVS), ethoxydiethylvinylsilane (EODEVS), diethoxyethylvinylsilane (DEOEVS), dimethoxyethylvinylsilane (DMOEVS), ethoxydimethylvinylsilane (EODMVS), methoxydiethylvinylsilane (MODEVS) and ethylmethoxymethylvinylsilane (EMOMVS).

In the middle of the piping 14, a liquid massflow controller 15B is disposed, thereby a flow rate of the treatment agent pumped out of the treatment agent tank 17 being controlled. Upstream the massflow controller 15B in a direction of movement of the treatment agent, an opening valve 15C is disposed, downstream the massflow controller 15B in a direction of movement of the treatment agent an opening valve 15C being disposed.

In the middle of the piping 14B connecting the massflow controller 15B and the opening valve 15C, a branch line 14C is connected to function as a drain, an opening valve 15D being disposed thereto. Further downstream the opening valve 15C, a vaporizer 16 is disposed to vaporize the treatment agent there. The piping 14D further downstream the vaporizer 16 is connected through the opening valve 16C to the showerhead 13. In the middle of the piping 14D, a branch line 14E is connected to function as a drain, an opening valve 16E being disposed there.

To the vaporizer 16, another cleaning piping 20 is disposed independently from the piping 14. As shown in FIG. 2, to piping 20A upstream the cleaning piping 20 connected to the vaporizer 16, a cleaning agent tank 21 is connected to accommodate the cleaning agent such as for instance trifluoroacetic acid (TFA).

At an upper portion of the cleaning agent tank 21, inert gas supply piping 22 for supplying an inert gas such as Ar or the like is disposed together with an opening valve 23. Through the piping 22, the inert gas such as Ar or the like is supplied in the cleaning agent tank 21. Thereby, a liquid surface of the cleaning agent is pushed down to supply the cleaning agent in the cleaning agent tank 21 into the piping 20. In the middle of the piping 20, a liquid massflow controller 25 is disposed, a flow rate of the cleaning agent pumped out of the cleaning agent tank 21 being controlled. Upstream the massflow controller 25 in a direction of movement of the cleaning agent, an opening valve 24 is disposed. In addition, downstream the massflow controller 25 in a direction of movement of the cleaning agent, an opening valve 27 is disposed.

In the middle of the piping 20B connecting the massflow controller 25 and the opening valve 27, a branch line 20C is connected to function as a drain, an opening valve 26 being disposed to the branch line 20C. Further downstream the opening valve 27, a branch line 20D is disposed, thereto 20D an opening valve 28 being disposed.

To the vaporizer 16 and the piping 14 downstream the vaporizer 16, a heater 30 such as a ribbon heater is disposed, heating the vaporizer 16 and the piping 14 downstream the vaporizer 16 to a prescribed temperature.

Figure 3:
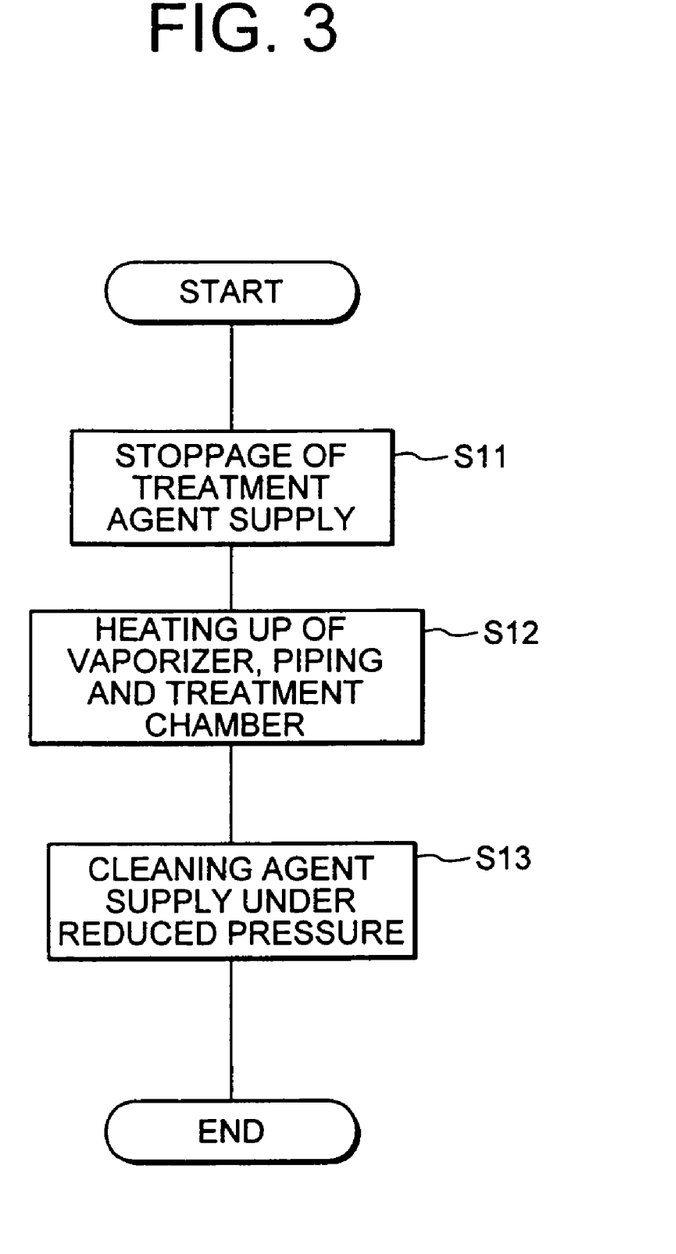
FIG. 3 is a flowchart of a cleaning method involving a first implementation mode.

Next, a procedure when cleaning the treatment equipment by the use of the cleaning method of the present invention will be explained. FIG. 3 is a flowchart showing a flow when the cleaning method of the present invention is implemented.

When cleaning the treatment equipment, first, valves such as opening valves 19, 15A and 15C are closed to stop supplying the treatment agent (step S11).

Then, the heater 30 is turned on to heat the vaporizer 16 and the piping 14 and the treatment chamber 1 downstream the vaporizer 16 up to for instance 300° C. (step S12).

Next, the opening valves 23, 24, 27 and 16C are opened and the massflow controller 25 is turned on to start supplying the cleaning agent (step S13).

When the cleaning agent is supplied from the cleaning agent tank 21 through the piping 20, the cleaning agent is vaporized due to the operation and heat of the vaporizer 16.

The vaporized cleaning agent comes into contact with the inner walls of the vaporizer 16 and the piping 14 and further with metal such as copper stuck on the inner wall of the treatment chamber 1. The insides of the vaporizer 16, the piping 14 and the treatment chamber 1 are heated to sufficiently high temperatures. Accordingly, the moment when the supplied cleaning agent and the metal come into contact, a complex is rapidly formed. The metal is, in the treatment equipment, material for forming the electrode and the interconnection of a semiconductor element.

The inside of the treatment chamber 1 is evacuated and maintained at a reduced pressure. Accordingly, the metal complex formed as in the above is sublimed and exhausted outside the treatment chamber 1.

As explained above, according to the cleaning method involving the present implementation mode, the treatment equipment is cleansed by the use of the cleaning gas containing a substance that directly complexes the metal that forms the electrode or the interconnection. Accordingly, the cleaning can be simply and shortly carried out with less labor.

In addition, due to the use of less expensive substances such as trifluoroacetic acid (TFA) as used in the above implementation mode, material cost necessary for cleaning can be reduced.

Furthermore, by the use of the treatment equipment furnished with a mechanism supplying the cleaning agent to the vaporizer of the treatment gas supply piping as shown in the above implementation mode, the metal such as copper stuck not only to the treatment chamber but also to the inside of the treatment gas supply piping can be cleaned with ease.

(2nd Implementation mode)

In the following, a second implementation mode of the present invention will be explained. In the following implementation modes, contents duplicating with the preceding implementation mode will be omitted from explanation.

The present implementation mode is configured in two steps of complexing metal stuck to the inside of the treatment chamber 1 and of subliming the generated complex due to evacuation to remove.

Figure 4:
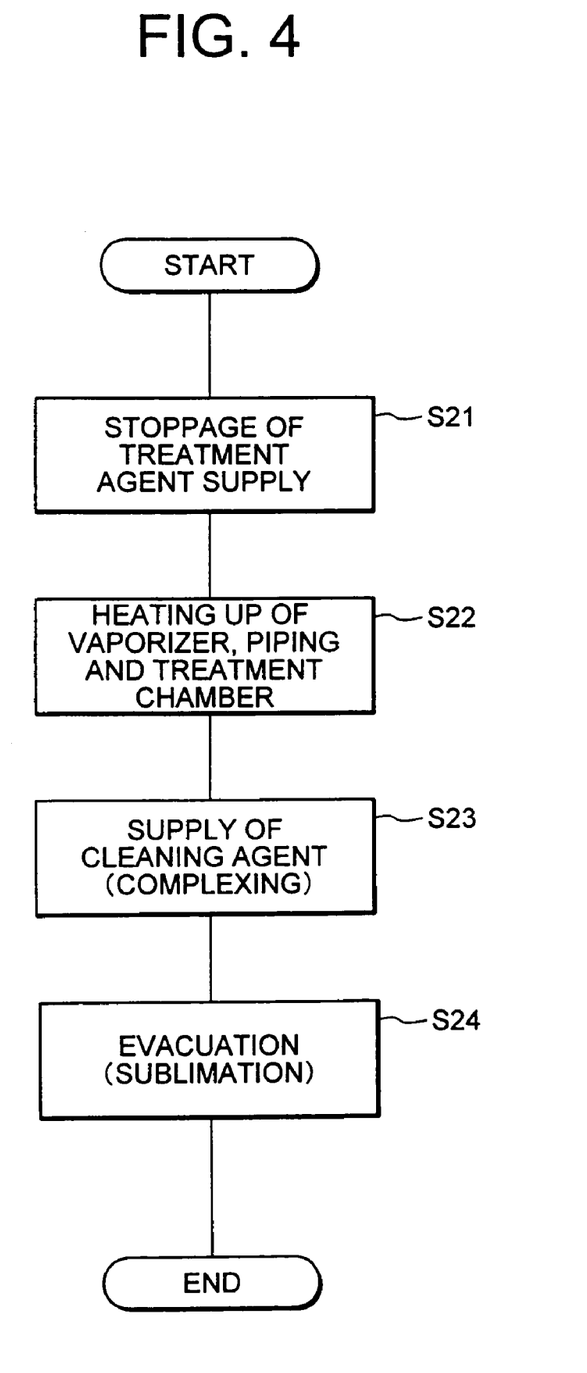
FIG. 4 is a flowchart of a cleaning method involving a second implementation mode.

FIG. 4 is a flowchart showing treatment steps of the cleaning method involving the present implementation mode.

When implementing the cleaning method involving the present implementation mode, first, as shown in the flowchart of FIG. 3, in the treatment equipment shown in FIG. 2, the valves such as opening valves 19, 15A and 15C are closed to stop the supply of the treatment agent (step S21).

Next, the heater 30 is turned on to heat the vaporizer 16 and the piping 14 and the treatment chamber 1 downstream the vaporizer 16 up to a prescribed temperature, for instance 300° C. (step S22).

Then, the opening valves 23, 24, 27 and 16C are opened and the mass flow controller 25 is turned on to start the supply of the cleaning agent (step S23).

Upon supplying the cleaning agent from the cleaning agent tank 21 through the piping 20, the cleaning agent is vaporized due to operation and heat of the vaporizer 16. The vaporized cleaning agent comes into contact with the inner walls of the vaporizer 16 and the piping 14 and further with metal stuck on the inner wall of the treatment chamber 1. The metal is one such as copper or the like that is used to form the electrode and the interconnection of a semiconductor element. At that time, the insides of the vaporizer 16, the piping 14 and the treatment chamber 1 are heated sufficiently high temperatures. Accordingly, the moment when the supplied cleaning agent and the metal come into contact, a complex is rapidly formed.

After the course of a prescribed time period to sufficiently complex the metal, the opening valves 23, 24 and 27 are closed to stop the supply of the cleaning agent.

Approximately simultaneously with the stoppage of the supply of the cleaning agent, a vacuum pump is operated to evacuate the inside of the treatment chamber 1 (step S24).

By evacuating the treatment chamber 1, the metal complex generated in the step S23 is sublimed to exhaust outside the treatment chamber 1.

As explained above, the cleaning method involving the present implementation mode is configured in two separate steps of complexing the metal and subliming the complex generated in the complexing step. As a result, the steps of complexing and subliming can be completely implemented, respectively, resulting in a peculiar effect of improving cleaning efficiency.

(3rd Implementation Mode)

In the following, a third implementation mode of the present invention will be explained.

The present implementation mode is configured so that the step of complexing the metal stuck to the treatment chamber and the step of subliming the generated complex due to the evacuation to remove are intermittently repeated.

Figure 5:
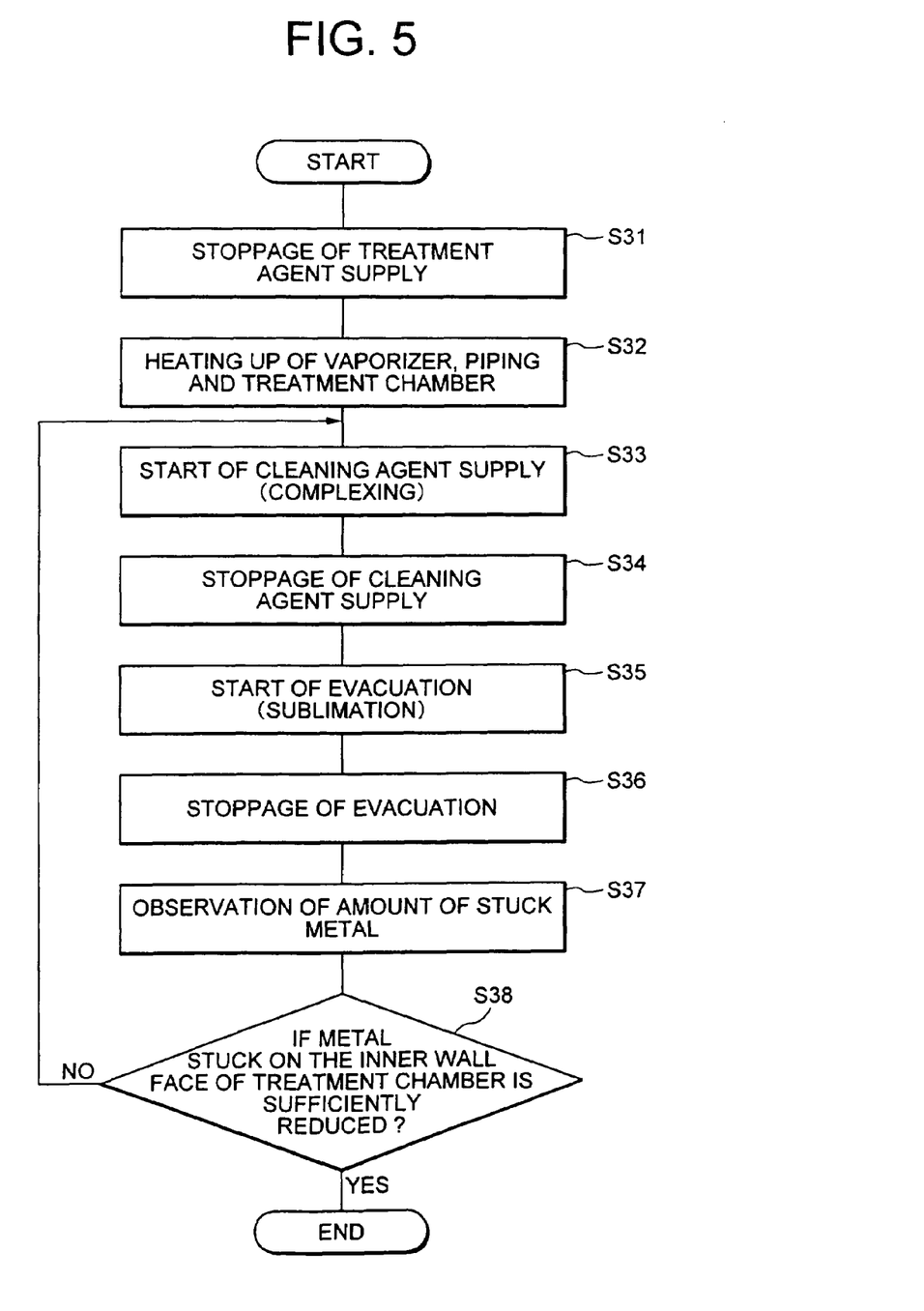
FIG. 5 is a flowchart of a cleaning method involving a third implementation mode.

FIG. 5 is a flowchart of a cleaning method involving the present implementation mode.

When implementing the cleaning method involving the present implementation mode, similarly with the second implementation mode, after the stoppage of supply of the treatment agent (step S31) and heating of the vaporizer, the piping and the treatment chamber (step S32), the cleaning agent is started supplying (step S33).

After the course of a prescribed time to sufficiently complex a surface of the metal stuck on the inner wall of the treatment chamber 1, the cleaning agent is stopped supplying (step S34). Then, the evacuation of the treatment chamber is began (step S35).

After the course of a prescribed time to sufficiently sublime the metal complex formed in the step S33 to evacuate outside the treatment chamber, the evacuation is stopped (step S36).

Next, an amount of the metal stuck on the inner wall surface of the treatment chamber 1 is confirmed (step S37). The confirmation operation may be implemented by directly observing a sticking state of metal on the inner wall of the treatment chamber or may be implemented by confirming a remaining amount of a metal film formed on a surface of a monitoring wafer W.

When, in the step S37, the amount of metal stuck on the inner wall surface of the treatment chamber 1 is confirmed to be sufficiently reduced, the cleaning is stopped.

On the contrary, when, in the step S37, the amount of metal stuck on the inner wall surface of the treatment chamber 1 is not confirmed to be sufficiently reduced, the operation of the steps from S33 to S37 are repeated. Thus, up to the complete removal of the stuck metal, the operation of cleaning is repeated.

As explained above, according to the cleaning method involving the present implementation mode, the steps of complexing the metal and of sublimating the complex formed through the complexing step are separated in two stages and intermittently repeated. Accordingly, the complexing and the sublimation can be completely implemented, resulting in an effect of improving cleaning efficiency.

(4th Implementation Mode)

In the following, a fourth implementation mode of the present invention will be described.

In the present implementation mode, in the step of complexing the metal stuck on the inner wall of the treatment chamber 1, an additive is added in the cleaning gas to promote the complexing of the metal. As specific steps, the treatment steps of FIGS. 3 to 5 explained in the first through third implementation modes can be applied. That is, in any one of the steps of S13 of FIG. 3, S23 of FIG. 4 and S33 of FIG. 5, together with the supply of the cleaning agent, the additive is only necessary to be added. As the additive for promoting the complexing, water vapor or oxygen can be used.

For instance, in the step S13 of FIG. 3, the cleaning agent (cleaning gas) vaporized in the vaporizer 16 is assumed to be supplied in the treatment chamber 1. Together with the supply of the cleaning gas into the treatment chamber 1, from the piping 29B water vapor is supplied into the treatment chamber 1.

As a result, the water vapor is added to the cleaning gas. The cleaning gas comes into contact with the metal such as copper stuck on the inner wall of the treatment chamber 1 to form complex. The water vapor that is added to the cleaning gas promotes the formation of the complex. The complexing of the metal is over in a short time, resultantly.

The addition of water vapor or the like to the cleaning gas is not necessarily implemented through the piping separate from the piping 14 that supplies the cleaning gas, but can be implemented by adding water vapor in the middle of the piping 14.

(Embodiment 1)

In the following, embodiments of the present invention will be explained.

With the treatment equipment explained in the aforementioned implementation modes, a wafer W on which surface copper of a thickness of 5000 angstrom is deposited is disposed on the susceptor 2. Thereafter, an atmosphere in the treatment chamber 1 is replaced by pure nitrogen. The susceptor 2 is heated to 300° C., followed by, through the supply piping 14, supplying a gas mixture of 35 sccm of TFA diluted by nitrogen. At that time, the pressure in the treatment chamber 1 is controlled to be $1.33 \times 10^4$ Pa (100 Torr). After the state of constant gas pressure is maintained for 10 min, the gas mixture of TFA and nitrogen is ceased to supply.

Thereafter, gas remaining in the treatment chamber 1 is evacuated, followed by taking out the wafer W.

From observations of the wafer W by means of a scanning electron microscope, it is confirmed that the copper on the wafer W is completely removed by means of the dry cleaning due to TFA.

(Embodiment 2)

With samples of the wafer W thereon copper is deposited similarly with Embodiment 1, the temperature (wafer temperature) of the susceptor 2 and the gas pressure in the treatment chamber 1 are varied to investigate an amount of etching of copper.

As the sample, a wafer W thereon copper is deposited is cut into squares of 2×2 mm to use. Furthermore, as the cleaning gas, a gas mixture of flow rate 37 sccm of TFA and flow rate 40 sccm of nitrogen is used. A constant gas pressure is maintained for 10 min to implement the complexing. After the stoppage of the gas supply, the evacuation is carried out to sublime the complex. Thereafter, the sample is taken out of the treatment chamber 1. The sample is compared with that before the cleaning in weight to obtain the amount of etched copper.

Figure 6:
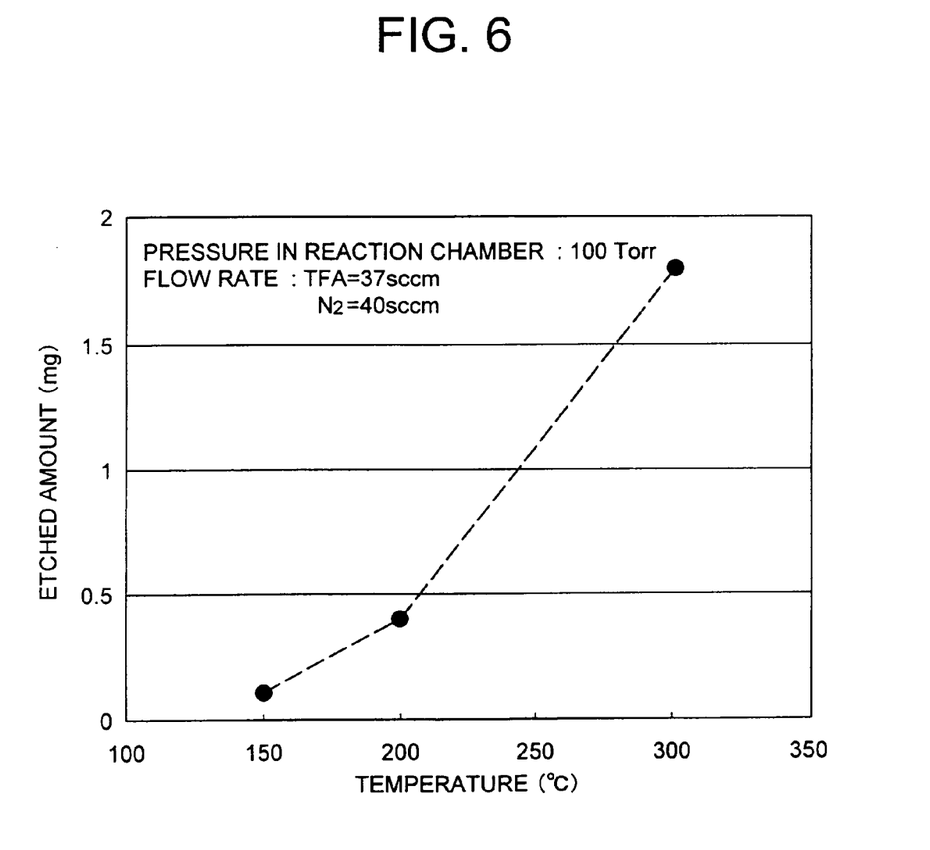
FIG. 6 is one graph showing results of cleaning due to a second embodiment.
Figure 7:
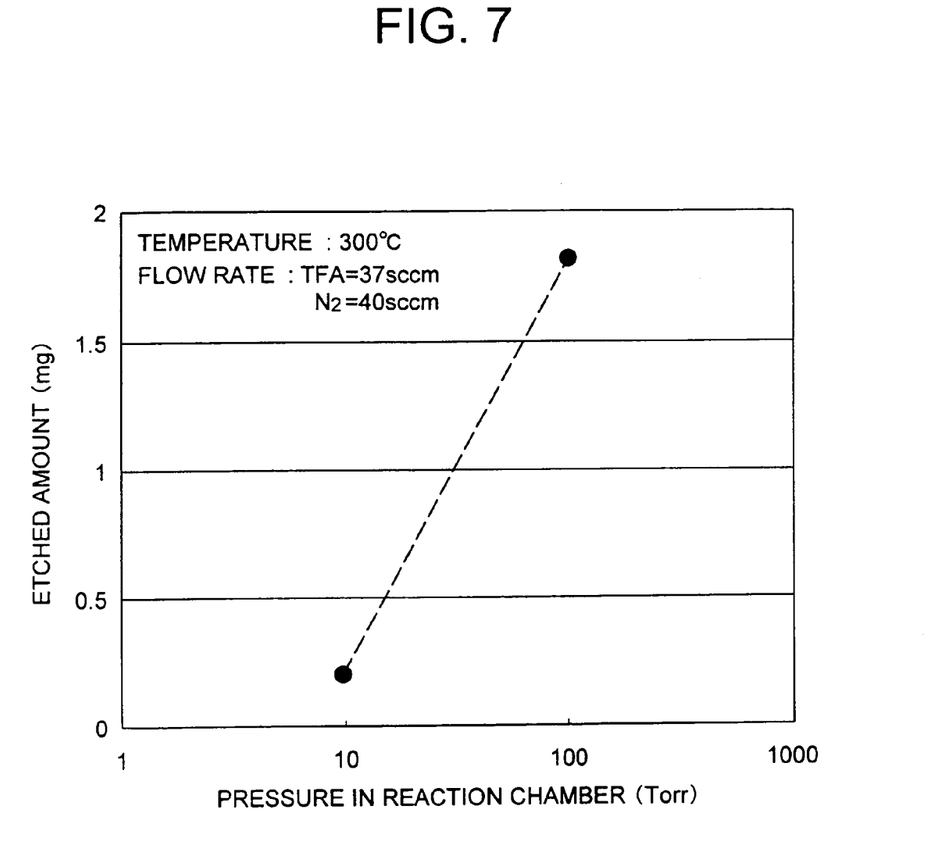
FIG. 7 is another graph showing results of cleaning due to a second embodiment.

FIG. 6 is a graph showing etched amount when, with a gas pressure in the treatment chamber 1 fixed at 100 Torr, the temperature of the susceptor 2 is varied from 150° C. to 300° C. FIG. 7 is a graph showing an etched amount when, with the temperature of the susceptor 2 fixed at 300° C., the gas pressure in the treatment chamber 1 is varied from 10 Torr to 100 Torr.

Abscissas of graphs of FIGS. 6 and 7 denote the temperature of the susceptor 2 and the gas pressure in the treatment chamber 1, respectively. Ordinates of graphs of FIGS. 6 and 7 each denote etched amount of copper expressed by the weight change (mg) before and after the cleaning.

From FIG. 6, as the temperature rises as 150, 200 and 300° C., the etched amount increases. From FIG. 7, as the gas pressure rises as 10, 100 Torr, the etched amount increases.

The times necessary for complexing in FIGS. 6 and 7 are the same. Accordingly, the increase of the etched amount means an increase of the speed of complexing, resultantly an increase of the speed of etching.

As mentioned above, due to the increase of the temperature and gas pressure, the speed of etching (speed of complexing) can be increased.

(Embodiment 3)

In the present embodiment 3, in the course of complexing, from the piping 29B water vapor is supplied to measure a change of weights of the etched copper.

Samples to measure, gas to use and flow rate of the gas are the same with Embodiment 2 (sample: wafer W of 2×2 mm thereon copper is deposited, cleaning gas: gas mixture of flow rate 37 sccm of TFA and flow rate 40 sccm of nitrogen). The temperature of the susceptor 2 and the gas pressure in the treatment chamber 1 are 300° C. and 100 Torr, respectively, that showed the maximum etched amount in Embodiment 2. The time for the step of complexing is 3 min.

Figure 8:
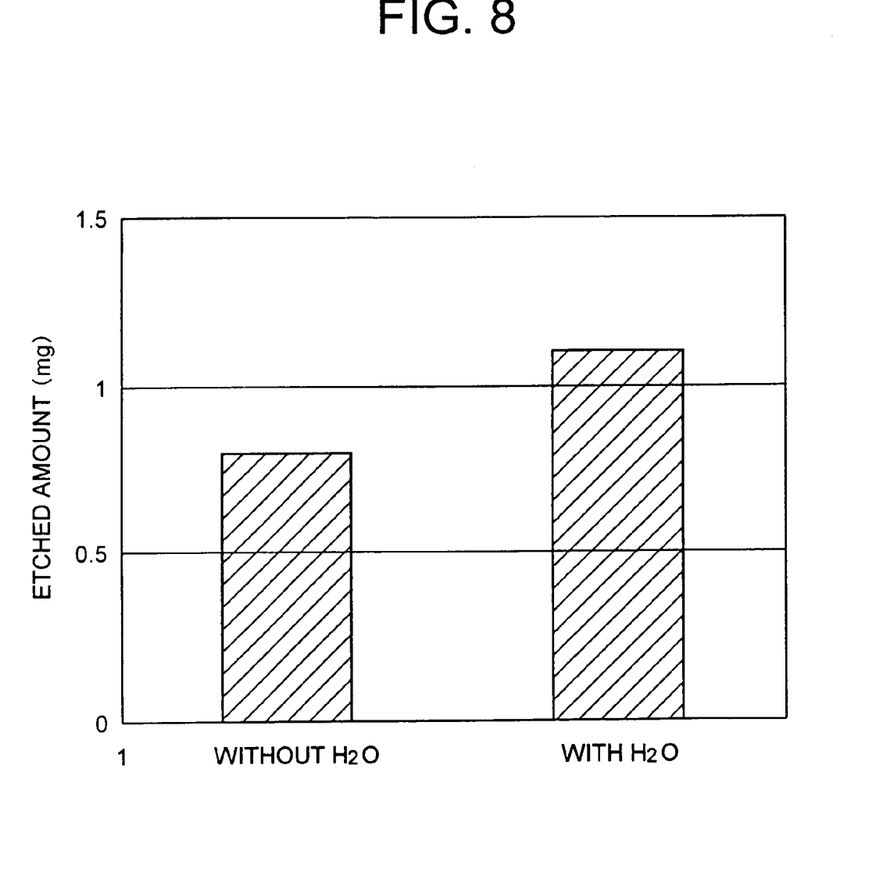
FIG. 8 is a graph showing results of cleaning due to a third embodiment.

FIG. 8 is a graph showing the etched amount of copper when water vapor is supplied in the treatment chamber 1 in the course of the complexing in comparison with the case where water vapor is not employed. The etched amount of copper is expressed, similarly with embodiment 2, by the weight change (mg) before and after the cleaning treatment. In the case of water vapor being supplied, water vapor is supplied by 8.5 sccm (as gas).

From FIG. 8, by adding water vapor to the cleaning gas by approximately 19 atomic %, the etched amount of copper is increased by 37%.

From the above, it is found that by the addition of the water vapor, the etching speed (complexing speed) can be improved.

(Other Implementation Mode)

The present invention is not restricted to the range set forth in the above implementation modes. In the aforementioned implementation modes, the explanation is given with CVD equipment as an example. However, the present invention can be applied in treatment equipment other than the CVD equipment, for instance in PVD equipment or the like.

Furthermore, in the above implementation modes, in the middle of the piping that supplies the treatment agent to the treatment chamber, the cleaning agent such as TFA or the like is supplied. The present invention also can be applied in the treatment equipment furnished with the piping for directly supplying the cleaning agent in the treatment chamber 1.

Furthermore, in the above implementation modes, the treatment equipment of Si wafers is explained as an example. However, the present invention also can be applied in the treatment equipment for treating glass substrates for liquid crystal display (LCD).

What is claimed is:

1. A method of a chamber of cleaning an interior of a treatment apparatus to remove a metal film formed on an inner wall of the chamber of the treatment apparatus, the treatment apparatus configured to form the metal film on a substrate, the treatment apparatus comprising (a) a first source supplying a treatment agent; (b) a second source supplying a cleaning agent comprising one of a carboxylic acid and a derivative of a carboxylic acid; (c) a vaporizer vaporizing the treatment agent and the cleaning agent; (d) a first pipe connecting the first source and the vaporizer, and supplying the treatment agent from the first source to the vaporizer; (e) a second pipe connecting the second source and the vaporizer, and supplying the cleaning agent from the second source to the vaporizer; (f) a chamber for forming the metal film on a substrate; (g) a susceptor mounting the substrate in the chamber; (h) a third pipe connecting the vaporizer and the chamber, and supplying the vaporized treatment agent or the vaporized cleaning agent from the vaporizer to the chamber; (i) a vacuum pump exhausting the chamber; and (j) a heat source heating the vaporizer, the third pipe, and the chamber, the method comprising:
- (i) forming the metal film inside the chamber;
- (ii) reducing a pressure in the chamber;
- (iii) heating the vaporizer, the third pipe, and the chamber by the heat source over a predetermined temperature;
- (iv) supplying the cleaning agent comprising one of the carboxylic acid and the derivative from the second source to the vaporizer through the second pipe to vaporize the cleaning agent;
- (v) supplying the vaporized cleaning agent from the vaporizer into the chamber through the third pipe;
- (vi) reacting the metal of the metal film and the vaporized cleaning agent to form a metal complex of the metal and the cleaning agent;
- (vii) subliming the metal complex by a heat of the heat source; and
- (viii) exhausting the sublimed metal complex by the vacuum pump to clean the chamber.

2. The method of claim 1, wherein one of the carboxylic acid and the derivative comprises a compound selected from the group comprising RCOOH, RCOOR', and R(COOH)$_n$, wherein R, R' are hydrocarbon groups containing halogen atoms, and wherein n is an integer.

3. The method of claim 1, wherein the carboxylic acid comprises trifluoroacetic acid.

4. The method of claim 1, wherein the treatment apparatus is a chemical vapor deposition equipment.

5. The method of claim 1, further comprising:
supplying an additive to the vaporized cleaning agent to promote formation of the metal complex of the cleaning agent and the metal.

6. The method of claim 5, wherein the additive includes oxygen or water vapor.

7. The method of claim 1, further comprising:
repeating said supplying the cleaning agent, repeating said supplying the vaporized cleaning agent, repeating said reacting the metal of the metal film and the vaporized cleaning agent, and repeating said subliming the metal complex.

8. The method of claim 1, wherein the metal is copper.

9. The method of claim 8, wherein, in said subliming the metal complex, the metal complex is copper complex and the copper complex is heated at a temperature of at least 150° C.

10. The method of claim 8, wherein, in said reacting the metal and the vaporized cleaning agent, the pressure of the vaporized cleaning agent is at least 10 Torr.

11. The method of claim 8, wherein in forming the metal film, the metal film including copper is formed from $Cu^{+1}$ (hexafluoroacetylacetonate) and silylolefin ligand.

12. The method of claim 11, wherein the silylolefin ligan is selected from the group consisting of trimethylvinylsilane (TMVS), dimethoxymethylvinylsilane (DMOMVS), methoxydimethylvinylsilane (MODMVS), trimethoxyvinylsilane (TMOVS), triethoxyvinylsilane (TEOVS), ethoxymethoxymethylvinylsilane (EOMOMVS), diethoxymethylvinylsilane (DEOMVS), diethoxymethoxyvinylsilane (DEOMOVS), ethoxydimethoxyvinylsilane (EODMOVS), ethoxydiethylvinylsilane (EODEVS), diethoxyethylvinylsilane (DEOEVS), dimethoxyethylvinylsilane (DMOEVS), ethoxydimethylvinylsilane (EODMVS), methoxydiethylvinylsilane (MODEVS) and ethylmethoxymethylvinylsilane (EMOMVS).

13. The method of claim 1, further comprising:
confirming the existence of the metal film inside the chamber; and
repeating said supplying the cleaning agent, repeating said supplying the vaporized cleaning agent, repeating said reacting the metal of the metal film and the vaporized cleaning agent to form a metal complex of the metal and the cleaning agent, and repeating said subliming the metal complex, if the existence of the metal film inside the chamber is confirmed.

14. The method of claim 1, wherein in said heating, the predetermined temperature is 300° C.

15. The method of claim 1, further comprising:
supplying water vapor into the chamber,
wherein the carboxylic acid is trifluoroacetic acid, and
reacting includes reacting the metal of the metal film and the vaporized cleaning agent in a presence of the supplied water vapor.

16. The method of claim 1,
wherein the vaporizer has a first opening, a second opening, and a third opening between the first opening and the second opening,
the first pipe connects to the first opening of the vaporizer,
the second pipe connects to the third opening of the vaporizer, and
the third pipe connects to the second opening of the vaporizer.

* * * * *